(12) United States Patent
Millman et al.

(10) Patent No.: US 6,374,203 B1
(45) Date of Patent: Apr. 16, 2002

(54) METHOD OF MODELING CIRCUIT CELLS WITH DISTRIBUTED SERIAL LOADS

(75) Inventors: Steven D. Millman; Markus Wloka, both of Chandler, AZ (US); Sean C. Tyler, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 868 days.

(21) Appl. No.: 08/596,857

(22) Filed: Feb. 5, 1996

(51) Int. Cl.⁷ .......................... G06F 9/455; G06F 17/50
(52) U.S. Cl. ............................................ 703/14; 716/17
(58) Field of Search ................. 395/500; 364/488–491, 364/578; 703/14; 716/17

(56) References Cited

U.S. PATENT DOCUMENTS

| | | | | |
|---|---|---|---|---|
| 5,379,232 A | * | 1/1995 | Komoda | 364/489 |
| 5,452,225 A | * | 9/1995 | Hammer | 364/488 |
| 5,610,833 A | * | 3/1997 | Chang et al. | 364/491 |
| 5,655,109 A | * | 8/1997 | Hamid | 395/500 |

OTHER PUBLICATIONS

Koskinen et al., T. Hierarchical Tolerance Analysis Using Statistical Behavioral Models, IEEE Transactions on Computer–Aided Design of Integrated Circuits and Systems, vol. 15, No. 5, May 1996, pp. 506–516.*

Pritchard et al., T.I. Development of Generic Testing Strategies for Mixed–Signal Integrated Circuits, IEE Proceedings G, Circuits, Devices and Systems, vol.: 139, Issue: 2, pp. 231–233.*

* cited by examiner

Primary Examiner—Russell W. Frejd
(74) Attorney, Agent, or Firm—Robert D. Atkins; Lanny L. Parker

(57) ABSTRACT

A plurality of serially coupled circuit cells (12–20) are modeled as a distributed serial load. The distributed serial load provides an accurate load model in situations where one cell is effected by loading on subsequent circuit cells, i.e. downstream loading is conveyed back to the first cell. The capacitance (22) and resistance (24, of each cell has a loading effect on each previous cell. The effective resistance and capacitive values of each cell is identified and maintained as one element of the distributed serial load model. The distributed serial load accurately models the loading of unbuffered cells (16–20). The distributed serial load is also applicable to portions of circuit cells (38,40) that are not be buffered and where the downstream loading has an effect on previous circuit drivers (14).

20 Claims, 2 Drawing Sheets

METHOD OF MODELING CIRCUIT CELLS WITH DISTRIBUTED SERIAL LOADS

BACKGROUND OF THE INVENTION

The present invention relates in general to circuit simulation and, more particularly, to a method of modeling a plurality of serially coupled circuit cells with a distributed serial load.

Integrated circuit designs are becoming more complex while the time allocated for the design effort is decreasing. To satisfy these conflicting concerns, circuit designers are turning to libraries of standard cells from which to build the overall design. A standard cell is a pre-designed and pre-tested functional block that can be plugged into a circuit. The standard cell library includes a myriad of functional blocks such NAND and NOR gates, multiplexers, memories, counters, multipliers, flipflops, etc. The standard cell can be as simple as an inverter and as complex as an arithmetic logic unit. Thus, standard cell libraries of pre-defined circuit functions are the building blocks for more complex circuits. Building the circuit with cells from a library is very efficient especially for ASICs or other standard cell designs.

The library typically includes simulation data for each standard cell. The simulation data characterizes the standard cell by parameters such as manufacturing process, supply voltage, temperature, edge transition rate, and output load. The characterization parameters are useful when running a computer aided design (CAD) simulation such as SPICE to test the various features before a physical embodiment is built. The SPICE simulator solves a number of voltage and current equations to determine the performance of the cell. Each equation is a function of many other voltages and currents in other nodes and transistors. The integrated circuit is thus mathematically modeled in the computer simulator whereby the design parameters are verified or manipulated to work out the inevitable problems associated with different embodiments before proceeding with the cost and effort of building an actual circuit.

Characterizing the output load of the cell is an important concern of the present invention. In the prior art, the output load of a cell is typically modeled by placing a single lumped capacitor at the output of the cell. The lumped capacitor models the effective capacitive load, e.g. number of devices being driven, as seen by the output driver of the cell. A common design rule for standard cell construction is to buffer each and every input and output of the cell. The buffering assures that the output of any cell is loaded by no more than the input buffer of the next cell(s). The output load of one buffer is unaffected by any output load of any cell it is driving. Unfortunately, a lumped effective capacitive load does not accurately model situations where the output load of one cell is influenced by the load on subsequent cells. For example, if a first circuit cell drives a second circuit cell that has no buffered input and no buffered output, then the loading on the output of the second circuit cell has an effect on the output load of the first circuit cell. A single lumped capacitor does not accurately model such unbuffered cells that do have an influence on the prior cells.

Hence, a need exists to accurately model circuit cells where the output load is influenced by the load on subsequent unbuffered cells.

DETAILED DESCRIPTION OF THE PREFERRED EMBODIMENT

Figure 1:
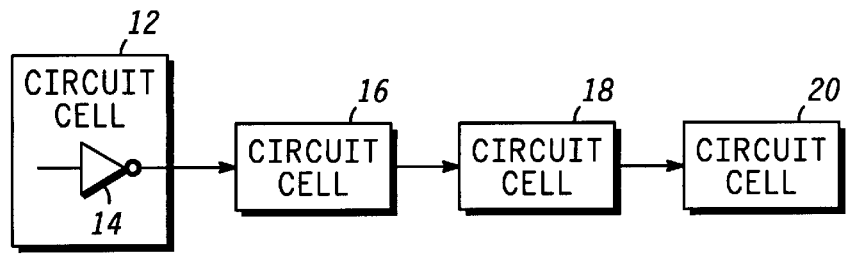
FIG. 1 is a block diagram illustrating a plurality of serially coupled circuit cells.

Referring to FIG. 1, a circuit cell 12 provides a predetermined logic function such as a NAND or NOR gate, inverter, flipflop, multiplexer, memory, counter; arithmetic logic unit, etc. Cell 12 includes an output buffer 14 that drives serially coupled circuit cell 16, circuit cell 18 and circuit cell 20. The prior art generally requires that the input and output of each cell include a buffer to isolate it from any cell other than an adjacent cell. Thus, if the output of cell 16 is buffered, then buffer 14 in cell 12 is not effected by the loading of cell 18 or cell 20. The requirement to buffer the input and output of each cell is often inefficient and leads to unnecessary complexity and excessive circuit simulation times. In many applications, it is necessary to have a plurality of serially coupled cells, such as cells 16, 18, and 20, where each cell has a loading effect on cell 12. That is, with the input and output of each cell unbuffered, buffer 14 becomes serially loaded by the combination of cell 16, cell 18, and cell 20. The serially loading cannot be accurately modeled by placing a single lumped capacitor at the output of buffer 14 in cell 12.

As a feature of the present invention, the loading on circuit cell 12 is modeled as a distributed network of serial loads. In one embodiment shown in FIG. 2, cell 16 is modeled with an RC network of capacitor 22 and resistor 24 that together represent the effective load impedance of cell 16. Capacitor 22 is coupled between an input node of cell 16 and a ground conductor. Resistor 24 is coupled between the input node of cell 16 and its output node. Cell 18 is modeled with an RC network of capacitor 26 and resistor 28 that together represent the effective load impedance of cell 18. Capacitor 26 is coupled between an input node of cell 18 and the ground conductor. Resistor 28 is coupled between the input node of cell 18 and its output node. Cell 20 is modeled with an RC network of capacitor 30 and resistor 32 that together represent the effective load impedance of cell 20. The output of last cell in the serial chain is coupled to load termination buffer 34. The impedance of the distributed network provides an accurate load model for cell 12 in cases where the input and output of cells 16–20 are unbuffered and transparent, and therefore influence the loading on buffer 14. The distributed serial load of cells 16–20 allows the loading effect to be evaluated at the output of buffer 14 in cell 12, at the output of the last cell in the serial chain, i.e. cell 20, and at the output of termination buffer 34. Additional serial loads can be appended to the serial chain after cell 20. The number of serial loads on the output of cell 12 is a function of the circuit design. A circuit simulator, which is typically a computer program such as SPICE running on a computer workstation, simulates the loading behavior and dynamics on buffer 14 with the distributed serial loads 22–32 representing the load model.

Figure 3:
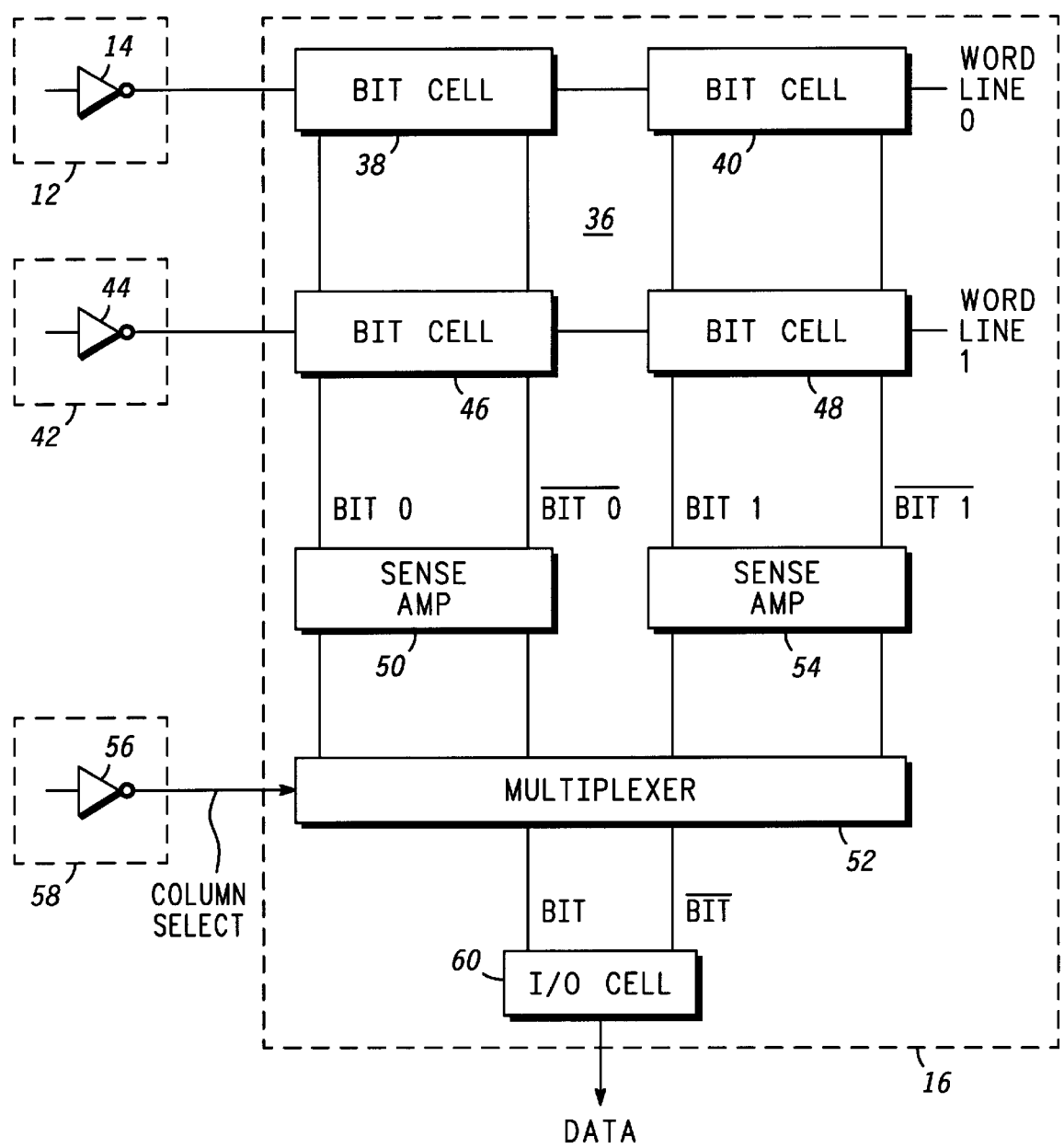
FIG. 3 is a block diagram illustrating a memory array.

The distributed serial load characteristic model is also applicable within a particular cell. In FIG. 3, circuit cell 16 is shown as memory array 36 with a plurality of bit cells. Buffer 14 in cell 12 drives WORDLINE0 in memory array 36. Bit cell 38 is responsive to WORDLINE0 for providing BIT0 and $\overline{BIT0}$. Bit cell 40 is responsive to WORDLINE0 for providing BIT1 and $\overline{BIT1}$. Circuit cell 42 includes buffer 44 for driving WORDLINE1. Bit cell 46 is responsive to WORDLINE1 for providing BIT0 and $\overline{\text{BIT0}}$, while bit cell 48 is responsive to WORDLINE1 for providing BIT1 and $\overline{\text{BIT1}}$. Sense amplifier 50 receives BIT0 and $\overline{\text{BIT0}}$ and provides complementary data signals to first inputs of multiplexer 52. Sense amplifier 54 receives BIT1 and $\overline{\text{BIT1}}$ and provides complementary data signals to second inputs of multiplexer 52. Buffer 56 in circuit cell 58 provides the COLUMN SELECT control signal to multiplexer 52 to select either the data signals from sense amplifier 50 or the data signals from sense amplifier 54 depending on the state of COLUMN SELECT. The outputs from multiplexer 52 are complementary data signals BIT and $\overline{\text{BIT}}$. I/O cell 60 receives complementary data signals BIT and $\overline{\text{BIT}}$ and provides a data signal DATA as the output of cell 16.

Figure 4:
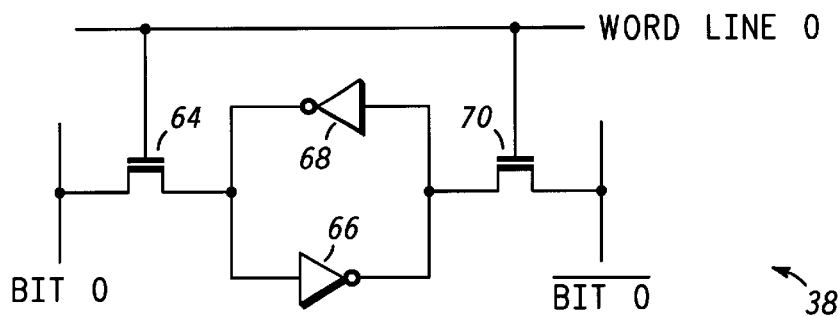
FIG. 4 is a schematic diagram illustrating one bit cell of the memory array of FIG. 3.

Further detail of bit cell 38 is shown in FIG. 4 including transistor 64 having a gate coupled to WORDLINE0 and a source coupled to $\overline{\text{BIT0}}$. Inverter 66 has an input coupled to the drain of transistor 64 and an output coupled to an input of inverter 68 and to the drain of transistor 70. The output of inverter 68 is coupled to the drain of transistor 64. Transistor 70 has a gate coupled to WORDLINE0 and a source coupled to $\overline{\text{BIT0}}$. Bit cells 40, 46, and 48 follow a similar construction as bit cell 38.

To store a value BIT0=1 and $\overline{\text{BIT0}}$=0 in bit cell 38, BIT0 is driven with a logic one and $\overline{\text{BIT0}}$ is driven with a logic zero. Buffer 14 sets WORDLINE0 to logic one to turn on transistors 64 and 70 which in turn drive the values BIT0=1 and $\overline{\text{BIT0}}$=0 onto inverters 66 and 68. When WORDLINE0 returns to logic zero, the output of inverter 66 latches to logic zero and the output of inverter 68 latches to logic one. To retrieve the contents of bit cell 38, BIT0 and $\overline{\text{BIT0}}$ are typically precharged to a logic one and then allowed to float in a high impedance state. Buffer 14 sets WORDLINE0 to logic one to turn on transistor 64 and transistor 70 which in turn allows the output of inverter 68 to drive BIT0 toward a logic one and the output of inverter 66 to drive $\overline{\text{BIT0}}$ toward a logic zero. Sense amplifier 50 senses the direction that BIT0 and $\overline{\text{BIT0}}$ are being driven by inverters 66 and 68 and aids in completing the transition. Buffer 56 sets COLUMN SELECT to logic zero to select the complementary data signals BIT0 and $\overline{\text{BIT0}}$ from sense amplifier 50. I/O cell 60 converts the complementary data signals BIT and $\overline{\text{BIT}}$ to a single logic one DATA signal.

Returning to FIG. 3, memory array 36 can be arranged in a variety of configurations of word widths and column lengths, e.g. 1024 rows by four 8-bit words per row, or 512 rows by two 16-bit words per row. For any particular arrangement, the bit cells load the outputs of cells 12 and 42. For example, the gales of transistors 64 and 70 in bit cell 38 and the gates of transistors 64 and 70 in bit cell 40 present a capacitive load on the output of buffer 14. The metal conductor WORDLINE0, which can have significant length in large memory arrays, also provides a resistive load on the output of buffer 14. When transistors 64 and 70 are enabled, inverter 68 is loaded by the resistance of conductor BIT0 and the capacitance of other bit cells on BIT0. Likewise, inverter 66 is loaded by the resistance on conductor $\overline{\text{BIT0}}$ and the capacitance of other bit cells on $\overline{\text{BIT0}}$.

In the prior art models, typically only a few common memory array arrangements are pre-characterized by placing a single lumped capacitor on the output of each buffer. Likewise, a single lumped capacitor is placed on the output of each buffer in the bit cell. When a particular memory configuration needed to be simulated, the closest memory array pre-characterization is used as the best available data, although not necessarily an accurate model. The lumped capacitors are inaccurate especially in large memory arrays where the word lines and bit lines have significant resistance because of the length of the conductors with capacitive loads interspersed along the conductor.

In the present invention, WORDLINE0 is modeled with a distributed serial load. The capacitance of the gates of transistors 64 and 70 in bit cell 38 is modeled as a first capacitor to ground potential similar to capacitor 22 in FIG. 2. The resistance of the WORDLINE0 conductor between the output of buffer 14 in cell 12 and the tap point of the gate of transistor 70 in bit cell 38 on WORDLINE0 is modeled as a first resistor similar to resistor 24 in FIG. 2. The first RC network 22–24 is identified as a model of the load of bit cell 38 on buffer 14.

Figure 2:
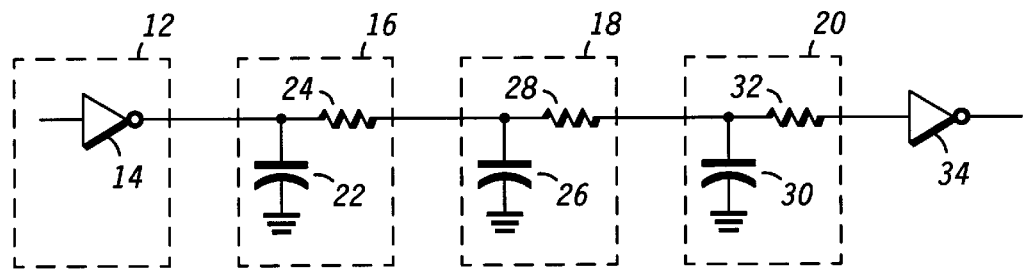
FIG. 2 is a block diagram illustrating a plurality of circuit cells modeled with a distributed serial load.

The capacitance of the gates of transistors 64 and 70 in bit cell 40 is modeled as a second capacitor to ground potential similar to capacitor 26 in FIG. 2. The resistance of the WORDLINE0 conductor between the tap point of the gate of transistor 70 in bit cell 38 on WORDLINE0 and the tap point of the gate of transistor 70 in bit cell 40 is modeled as a second resistor similar to resistor 28 in FIG. 2. The second RC network 26–28 is identified as a model of the load of bit cell 40 on buffer 14. If there are 32 bit cells attached to WORDLINE0, then there are thirty-one sets of RC models with the 32nd one being a model of the bit cell. The 32nd model is the termination load, e.g. another bit cell. Thus, the load on buffer 14 is modeled as a distributed serial load as shown in FIG. 2 to more accurately represent the actual behavior of the load on WORDLINE0 for buffer 14 in memory array 36. The circuit simulator characterizes the loading behavior and dynamics on buffer 14 based on the distributed serial load 22–32 representing the load model.

In a similar manner, WORDLINE1 is modeled with a distributed serial load. The capacitance of the gates of transistors 64 and 70 in bit cell 46 is modeled as a first capacitor to ground potential similar to capacitor 22 in FIG. 2. The resistance of the WORDLINE1 conductor between the output of buffer 14 and the tap point of the gate of transistor 70 in bit cell 46 on WORDLINE1 is modeled as a first resistor similar to resistor 24 in FIG. 2. The capacitance of the gates of transistors 64 and 70 in bit cell 48 is modeled as a second capacitor to ground potential similar to capacitor 26 in FIG. 2. The resistance of the WORDLINE1 conductor between the tap point of the gate of transistor 70 in bit cell 46 on WORDLINE1 and the tap point of the gate of transistor 70 in bit cell 48 is modeled as a second resistor similar to resistor 28 in FIG. 2.

The load on BIT0 is also modeled with a distributed serial load. Inverter 68 in bit cell 38 is taken as the output driver buffer. The capacitance of bit cell 46 on BIT0 is modeled as a capacitor to ground potential similar to capacitor 22 in FIG. 2. The resistance of the BIT0 conductor between the tap point of the source of transistor 64 in bit cell 38 on the BIT0 conductor and the tap point of the source of transistor 64 in bit cell 46 on the BIT0 conductor is modeled as a resistor similar to resistor 24. For the $\overline{\text{BIT0}}$ conductor, inverter 66 in bit cell 38 is assumed to be the output driver buffer. The capacitance of bit cell 46 on the $\overline{\text{BIT0}}$ conductor is modeled as a capacitor to ground potential similar to capacitor 22. The resistance of the $\overline{\text{BIT0}}$ conductor between the tap point of the source of transistor 70 in bit cell 38 on $\overline{\text{BIT0}}$ and the tap point of the source oft transistor 70 in bit cell 46 on the BIT0 conductor is modeled as a resistor similar to resistor 24. Thus, the load on inverters 66 and 68 in bit cell 38 is modeled as a distributed serial load as shown in FIG. 2 to more accurately represent the actual behavior of the load on BIT0 and $\overline{\text{BIT0}}$ for inverters 66 and 68 in bit cell 38.

The BIT1 conductor is modeled as a distributed serial load. Inverter 68 in bit cell 40 is taken as the output driver buffer. The capacitance of bit cell 48 on BIT1 is modeled as a capacitor to ground potential similar to capacitor 22. The resistance of the BIT1 conductor between the tap point of the source of transistor 64 in bit cell 40 on BIT1 and the tap point of the source of transistor 64 in bit cell 48 on BIT1 is modeled as a resistor similar to resistor 24. For the $\overline{BIT1}$ conductor, inverter 66 in bit cell 40 is taken as the output driver buffer. The capacitance of bit cell 48 on $\overline{BIT1}$ is modeled as a capacitor to ground potential similar to capacitor 22. The resistance of the $\overline{BIT1}$ conductor between the tap point of the source of transistor 70 in bit cell 40 on $\overline{BIT1}$ and the tap point of the source of transistor 70 in bit cell 48 on $\overline{BIT1}$ is modeled as a resistor similar to resistor 24. Thus, the load on inverters 66 and 68 in bit cell 40 is modeled as a distributed serial load as shown in FIG. 2 to more accurately represent the actual behavior of the load on BIT1 and $\overline{BIT1}$ for inverters 66 and 68 in bit cell 40. The circuit cell is typically characterized along the longest path, e.g. across WORDLINE0 and down $\overline{BIT1}$, for the longest delay.

All possible configurations are characterized by a circuit simulator and the results are stored in a database. When the end user selects a particular memory size, the distributed serial load model is retrieved from the database as a characterization of the memory configuration. The distributed serial load model is useful in situations where the load on one cell, e.g. cell 12, is affected by output loading on subsequent cells, e.g. cells 16, 18, and 20. Cells 16–20 affect the loading on cell 12 because the input and outputs of cells 16–20 are transparent and unbuffered. The distributed serial load model is also useful in situations where portions of a circuit, capacitance of the gates of transistors 64 and 70 and resistance of conductors between bit cells, must be individually characterized as a distributed serial load for an accurate load model.

Figure 5:
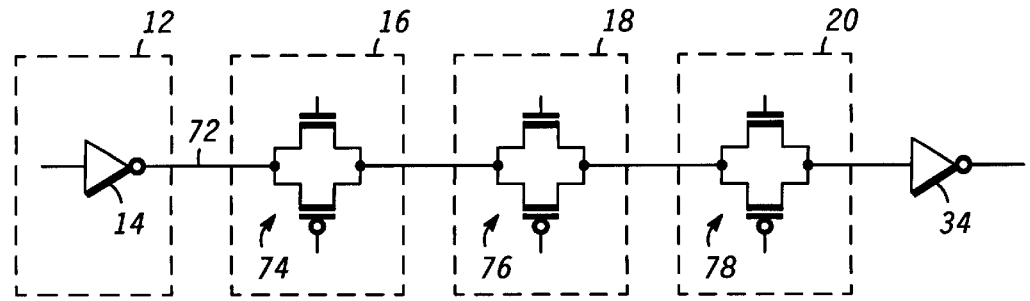
FIG. 5 illustrates an alternate distributed serial load with transmission gates in the circuit cells.

In another embodiment of the present invention, a data path includes a plurality of transmission gates serially coupled as shown in FIG. 5. Data path 72 includes cells 16–20. Cell 16 includes transmission gate 74 comprising n-channel and p-channel transistors with their drains and sources coupled together. Complementary control signals drive the gates of the transistors in transmission gate 74. Cell 18 includes transmission gate 76 comprising n-channel and p-channel transistors with their drains and sources coupled together. Complementary control signals drive the gates of the transistors in transmission gate 76. Cell 20 includes transmission gate 78 comprising n-channel and p-channel transistors with their drains and sources coupled together Complementary control signals drive the gates of the transistors in transmission gate 78.

The data path typically must operate with signals switching very rapidly Therefore transmission gates 74–76 are not buffered. The loading on buffer 14 in cell 12 is thus effected by the loading on transmission gate 74, and the loading on transmission gate 76, and the loading on transmission gate 78. Since the circuit simulator typically already has previously stored the effective impedance, e.g. resistance and capacitance, of each transmission gate, the distributed serial load can be modeled as the transmission gates themselves.

By now it should be appreciated that the present invention provides a distributed serial load model of a plurality of serially coupled circuit cells. Since the design rules do not require the input and output of each cell to be buffered, the loading on one cell is effected by loading on subsequent circuit cells, i.e. downstream loading is conveyed back to the first cell. The resistance and capacitance of each cell has a loading effect on each previous cell. The effective load impedance of the unbuffered cells cannot be accurately modeled by a single lumped capacitor. The effective resistance and capacitive values of each cell is identified and maintained as one element of the distributed serial load model. The distributed serial load accurately models the loading of unbuffered cells. The distributed serial load model is also applicable to portions of circuit cells that are not be buffered and where the downstream loading has an effect on previous circuit drivers.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A method of modeling loading of a plurality of serially coupled circuit cells, comprising the steps of:
   identifying effective load impedances for each of the plurality of serially coupled circuit cells where the circuit cells include active elements; and
   forming a distributed serial load with said effective load impedances where said distributed serial load provides a load model of the plurality of serially coupled circuit cells.

2. The method of claim 1 wherein said step of identifying effective load impedances includes the step of providing a first capacitance for a first one of the plurality of serially coupled circuit cells.

3. The method of claim 2 wherein said step of identifying effective load impedances further includes the step of providing a first resistance for said first one of the plurality of serially coupled circuit cells.

4. The method of claim 3 wherein said step of providing a first capacitance includes the step of providing said first capacitance between an input node of said first one of the plurality of serially coupled circuit cells and a ground conductor.

5. The method of claim 4 wherein said step of providing a first resistance includes the step of providing said first resistance between said input node of said first one of the plurality of serially coupled circuit cells and an output node of said first one of the plurality of serially coupled circuit cells.

6. The method of claim 5 wherein said step of identifying effective load impedances further includes the step of providing a second capacitance for a second one of the plurality of serially coupled circuit cells.

7. The method of claim 6 wherein said step of identifying effective load impedances further includes the step of providing a second resistance for said second one of the plurality of serially coupled circuit cells.

8. The method of claim 7 wherein said step of providing a second capacitance includes the step of providing said second capacitance between an input node of said second one of the plurality of serially coupled circuit cells and said ground conductor.

9. The method of claim 8 wherein said step of providing a second resistor includes the step of providing said second resistance between said input node of said second one of the plurality of serially coupled circuit cells and an output node of said second one of the plurality of serially coupled circuit cells.

10. A method of simulating characteristics of a plurality of serially coupled circuit cells, comprising the steps of:

providing a first load for a first one of the plurality of serially coupled circuit cells where the circuit cells include active elements;

providing a second load for a second one of the plurality of serially coupled circuit cells where the circuit cells include active elements; and forming a distributed serial load with said first and second loads of said first and second ones of the plurality of serially coupled circuit cells where said distributed serial load provides a characteristic load model of the plurality of serially coupled circuit cells.

11. The method of claim 10 wherein said step of providing a first load includes the step of providing a first capacitance between an input node of said first one of the plurality of serially coupled circuit cells and a ground conductor.

12. The method of claim 11 wherein said step of providing a first load further includes the step of providing a first resistance between said input node of said first one of the plurality of serially coupled circuit cells and an output node of said first one of the plurality of serially coupled circuit cells.

13. The method of claim 11 wherein said step of providing a second load includes the steps of:

providing a second capacitance between an input node of said second one of the plurality of serially coupled circuit cells and said ground conductor; and providing a second resistance between said input node of said second one of the plurality of serially coupled circuit cells and an output node of said second one of the plurality of serially coupled circuit cells.

14. A method of simulating characteristics of a plurality of serially coupled circuit cells, comprising the steps of:

providing a first load for a first one of the plurality of serially coupled circuit cells where the circuit cells include active elements, wherein said step of providing a first load includes the step of providing a first transmission gate between an input node of said first one of the plurality of serially coupled circuit cells and an output node of said first one of the plurality of serially coupled circuit cells;

providing a second load for a second one of the plurality of serially coupled circuit cells where the circuit cells include active elements; and forming a distributed serial load with said first and second loads of said first and second ones of the plurality of serially coupled circuit cells where said distributed serial load provides a characteristic load model of the plurality of serially coupled circuit cells.

15. The method of claim 14 wherein said step of providing a first load includes the step of providing a second transmission gate between an input node of said second one of the plurality of serially coupled circuit cells and an output node of said second one of the plurality of serially coupled circuit cells.

16. A method of modeling a memory array, comprising the steps of:

providing a first effective load impedance for a first bit cell of the memory arrays providing a second effective load impedance for a second bit cell of the memory array, and forming a distributed serial load with said first and second effective load impedances of said first and second bit cells where said distributed serial load provides a characteristic load model of the memory array.

17. The method of claim 16 wherein said step of providing a first effective load impedance includes the step of providing a first capacitance between an input node of said first bit cell and a ground conductor.

18. The method of claim 17 wherein said step of providing a first effective load impedance further includes the step of providing a first resistance between said input node of said first bit cell and an output node of said first bit cell.

19. The method of claim 18 wherein said step of providing a second effective load impedance includes the step of providing a second capacitance between an input node of said second bit cell and said ground conductor.

20. The method of claim 19 wherein said step of providing a second effective load impedance further includes the step of providing a second resistance between said input node of said second bit cell and an output node of said second bit cell.

* * * * *